(12) United States Patent
Tanibuchi

(10) Patent No.: US 8,252,435 B2
(45) Date of Patent: Aug. 28, 2012

(54) CUTTING TOOL, PROCESS FOR PRODUCING THE SAME, AND METHOD OF CUTTING

(75) Inventor: Takahito Tanibuchi, Kagoshima (JP)

(73) Assignee: Kyocera Corporation, Kyoto (JP)

( * ) Notice: Subject to any disclaimer, the term of this patent is extended or adjusted under 35 U.S.C. 154(b) by 565 days.

(21) Appl. No.: 12/305,241

(22) PCT Filed: Aug. 30, 2007

(86) PCT No.: PCT/JP2007/066922
§ 371 (c)(1),
(2), (4) Date: Apr. 22, 2009

(87) PCT Pub. No.: WO2008/026700
PCT Pub. Date: Mar. 6, 2008

(65) Prior Publication Data
US 2009/0223333 A1    Sep. 10, 2009

(30) Foreign Application Priority Data

Aug. 31, 2006   (JP) .................................. 2006-234916

(51) Int. Cl.
*B32B 9/00*    (2006.01)
(52) U.S. Cl. ....... 428/698; 51/307; 51/309; 427/255.28; 427/255.31; 427/255.39; 427/255.391; 427/255.394; 427/299; 427/314; 428/697; 428/699; 428/704
(58) Field of Classification Search ............ 51/307, 51/309; 428/697, 698, 699, 704; 427/299, 427/314, 255.28, 255.31, 255.39, 255.391, 427/255.394
See application file for complete search history.

(56) References Cited

U.S. PATENT DOCUMENTS

| | | | | |
|---|---|---|---|---|
| 4,276,096 | A | * | 6/1981 | Kolaska et al. .................. 75/238 |
| 4,374,685 | A | * | 2/1983 | Suzuki et al. .................. 428/547 |
| 4,649,084 | A | * | 3/1987 | Hale et al. ...................... 428/698 |
| 5,403,628 | A | * | 4/1995 | Konig et al. ............ 427/255.394 |
| 5,624,766 | A | * | 4/1997 | Moriguchi et al. ........... 407/119 |
| 6,193,777 | B1 | | 2/2001 | Weini et al. |
| 6,221,469 | B1 | | 4/2001 | Ruppi |

(Continued)

FOREIGN PATENT DOCUMENTS

JP            57-005860      *   1/1982

(Continued)

*Primary Examiner* — Archene Turner
(74) *Attorney, Agent, or Firm* — Procopio, Cory, Hargreaves & Savitch LLP

(57) ABSTRACT

[PROBLEMS] To provide a cutting tool consisting of a hard material improved in the adherence between a substratum of cemented carbide having hard phases bound by a binder metal and a TiN layer superimposed on a surface of the substratum, and provide a process for producing the same. [MEANS FOR SOLVING PROBLEMS] There is provided a cutting tool consisting of a hard material, characterized in that the hard material has a substratum containing hard phases and a binder metal and a TiN layer superimposed on a surface of the substratum, and that the substratum has β-phases consisting of at least one solid solution of carbide, nitride or carbonitride containing W and at least one member selected from among Ti, Ta, Nb and Zr, and that at least some of the β-phases lie at a surface of the substratum, and that the TiN layer has crystals with the same orientation relationship as that of β-phase crystals just above the β-phases of the substratum surface.

11 Claims, 2 Drawing Sheets

U.S. PATENT DOCUMENTS

| | | | |
|---|---|---|---|
| 6,251,508 B1 * | 6/2001 | Ruppi | 428/697 |
| 6,797,369 B2 * | 9/2004 | Usami et al. | 428/698 |
| 6,872,234 B2 * | 3/2005 | Shibata | 75/245 |
| 2001/0016273 A1 * | 8/2001 | Narasimhan et al. | 428/699 |
| 2003/0129456 A1 | 7/2003 | Usami et al. | |

FOREIGN PATENT DOCUMENTS

| | | | |
|---|---|---|---|
| JP | 58-067859 | * | 4/1983 |
| JP | 60-108253 | * | 4/1991 |
| JP | 950944912 | | 2/1993 |
| JP | 07-243023 | | 9/1995 |
| JP | 08-118105 | | 5/1996 |
| JP | 2004-249380 | | 9/2004 |
| JP | 2005-111574 | | 4/2005 |
| JP | 2005-271193 | | 10/2005 |
| JP | 2005-336565 | | 12/2005 |

* cited by examiner

CUTTING TOOL, PROCESS FOR PRODUCING THE SAME, AND METHOD OF CUTTING

CROSS-REFERENCE TO RELATED APPLICATION

This application is the United States national stage application of international application serial number PCT/JP2007/066922, filed Aug. 30, 2007, which claims priority to Japanese Patent Application number JP2006-234916, filed Aug. 31, 2006, each of which is incorporated herein by reference in its entirety.

TECHNICAL FIELD

The present invention relates to a cutting tool used in metal cutting or the like, a method of producing the same, and a cutting method using the same.

BACKGROUND ART

Hard materials obtained by coating TiC, TiCN, TiN, or $Al_2O_3$, on a surface of a substrate made of, for example, cemented carbide or cermet using a chemical vapor deposition (CVD) or a physical vapor deposition (PVD) are conventionally used in a cutting tool. Such a cutting tool is widely used in a variety of fields such as metal cutting work due to wear resistance of its coating layer(s) and toughness of its substrate.

However, there has been a problem that if such a cutting tool has weak adhesion between the substrate and the coating layer(s) deposited thereon, the coating layer(s) may be peeled from the substrate during the cutting process, and the cutting tool may rapidly wear down, reducing its lifetime. There has been another problem that if hard impact is applied to the cutting edge during the cutting process, the coating layer(s) may be peeled due to the weak adhesion between the substrate and the coating layer(s) deposited thereon, and the cutting tool may be fractured.

In order to solve the aforementioned problems, a method of improving adhesion between the substrate and the coating layer(s), in which the surface of the substrate is roughened to increase its surface area so as to obtain an anchor effect (refer to Patent Document 1), have been conventionally proposed. Also, there has been proposed a method of improving adhesion between the substrate and the coating layer(s) by diffusing constitutive elements of the substrate to the coating layer(s)(refer to Patent Documents 2 or 3).

Specifically, a first layer of TiC or TiN, a second layer of TiCN including columnar crystal, a third layer of TiC, TiCO or the like, and a fourth layer of $Al_2O_3$ are sequentially coated on the surface made of WC-based cemented carbide containing Co using the CVD method, in which components W and Co contained in the substrate are diffused to the first and second layers or to the first to third layers.

Patent Document 1: Japanese Patent Application Laid-Open No. 5-44012
Patent Document 2: Japanese Patent Application Laid-Open No. 7-243023
Patent Document 3: Japanese Patent Application Laid-Open No. 8-118105

DISCLOSURE OF THE INVENTION

Problems to be Solved by the Invention

However, in the method of improving adhesion between the substrate and the coating layer(s) by roughening the surface of the substrate to obtain an anchor effect, there has been a problem that the crystalline state of the coating layer(s) deposited on the roughened surface of the substrate varies and thus, the adhesion between the substrate and the coating layer(s) cannot be sufficiently improved.

In the method of diffusing compositional materials of the substrate to the coating layer(s) to improve adhesion between the substrate and the coating layer(s), it can be seen that the diffusion layer is obviously non-uniform when closely observing the diffusion inside of the coating layer(s) from the surface of the substrate. Specifically, a diffusion amount is very high in a part where a Co component serving as a binding metal is exposed on the surface of the substrate. However, the diffusion is not sufficient in a part having the surface of a cubic structure compound such as tungsten carbide. Therefore, there has been a problem that the adhesion between the substrate and the coating layer(s) cannot be sufficiently improved.

In view of the aforementioned problems, the invention aims to provide a cutting tool made of hard materials having improved adhesion between a substrate made of cemented carbide obtained by combining a hard phase with a binding metal and a TiN layer deposited on the surface of the substrate, and a method of processing the same.

Means for Solving the Problems

A cutting tool according to the present invention is made of a hard material, wherein: the hard material has a substrate including a hard material and a binding metal and a TiN layer deposited thereon; the substrate has a β-phase of solid solution of at least one type selected from a group consisting of carbide, nitride, and carbonitride containing W and a material selected from a group consisting of Ti, Ta, Nb, and Zr; at least part of the β-phase is formed on the surface of the substrate; and the TiN layer has crystals, which have the same orientation as the β-phase, right above the β-phase.

A method of producing a cutting tool made of a hard material according to the present invention includes: a process for grinding a substrate including a hard material, a binding metal, and a β-phase made of solid solution of at least one type selected from a group consisting of carbide, nitride, and carbonitride containing W and a material selected from a group consisting of Ti, Ta, Nb, and Zr to expose the β-phase on a surface of the substrate; a pre-process process for oxidization reduction of the surface of the substrate and generation of N dangling bonds on the surface of the substrate; and a forming process of a TiN layer for forming a TiN layer having an epitaxial growth portion right above the β-phase exposed on the surface of the substrate using chemical vapor deposition.

Effect of the Invention

According to the present invention, it is possible to improve adhesion between the substrate and the coating layer(s). This makes it possible to prevent defects caused by film peeling that can occur in the cutting process, and to provide a cutting tool having improved fracture resistance.

BEST MODE FOR CARRYING OUT THE INVENTION

The invention relates to a cutting tool used in cutting metals or the like. Particularly, the invention relates to a cutting tool made of hard materials which include a substrate made of cemented carbide obtained by combining a hard phase with a binding metal, and at least a TiN layer deposited on the surface of the substrate.

The cutting tool described above may include tools having a cutting edge part to contribute to the cutting, such as a solid type drill or an a solid type end mill, or a chip used in a soldering type or throw-away type turning tool.

A substrate of the present invention includes a hard phase and binding metal. Preferably, the hard phase of the present invention includes at least one type of material selected from a carbide, nitride, and carbonitride of metal in groups IV, V, and VI of the periodic table. Specifically, it contains tungsten carbide (WC) as a main component, and also contains titanium carbide, tantalum carbide, niobium carbide, zirconium carbide, or the like as subsidiary components. Any binding metal conventionally used in the art can be used. For example, iron group metals such as Fe, Ni, or Co can be used.

A coating layer is deposited on the surface of the substrate. The coating layer may be a single layer or a multilayer. According to the present invention, a TiN layer is deposited closest to the substrate in the coating layer(s). Preferably, a TiCN layer e.g., including columnar crystal, a TiC layer, a TiCO layer, an $Al_2O_3$ layer are appropriately deposited on the TiN layer.

A substrate according to the present invention has a β-phase made of solid solution of at least one type selected from a group consisting of carbide, nitride, and carbonitride containing W and a material selected from a group consisting of Ti, Ta, Nb, and Zr.

According to the present invention, the TiN layer has a crystal, right above the β-phase at the surface of the substrate, having the same orientation as that of the β-phase (i.e., an epitaxial). That is, the TiN layer has portions epitaxially grown on the β-phase in an interface with the substrate. This improves adhesion between the substrate and the coating layer(s).

Epitaxial growth means a process of growing crystals on a substrate, the crystals having the same orientation as the substrate.

Epitaxially grown crystals can be examined by analyzing that the stripes (lattice fringes) of the crystal lattices are apparently continuous from the β-phase of the substrate to grains of the TiN layer right above thereof when observing the β-phase and grains of the TiN layer with a magnification of ×2,000,000 using a transmission electron microscope and analyzing that the β-phase and the TiN grain can be seen as images indicating the same lattice structure in selected-area electron diffraction images thereof.

Preferably, the substrate contains the β-phase crystals within the range of 1 to 8 wt %. Within this range, the adhesion between the TiN layer and the substrate and the strength of the substrate are well balanced. For this reason, wear resistance and defect resistance of the cutting tool are improved. In addition, when the substrate contains 1 wt % or more of β-phase crystals, the area occupied by the TiN layer epitaxially grown on the β-phase increases. Also, the adhesion between the substrate and the TiN layer is likely to be improved. When the substrate contains 8 wt % or less β-phase crystals, they are appropriately distributed and seldom agglomerated in the substrate. This restrains generation of agglomerated portions of the β-phase that may act as an origin for destruction, and allows the tool to attain further improved fracture resistance.

Preferably, the interface between the substrate and the TiN layer has Rmax of 0.05 to 0.35 μm with respect to a reference length of 10 μm. Particularly, it is more preferable to have Rmax of 0.1 to 0.2 μm.

When Rmax is 0.05 μm or higher, the processed surface is appropriately active, and the surface of the substrate can be prevented from being excessively oxidized after processing, therefore the TiN layer can epitaxially grow on the β-phase readily. When Rmax is 0.35 μm or lower, the surface is kept smooth, and thus, the TiN layer can epitaxially grow on the β-phase readily.

When the average width of TiN crystals in a perpendicular direction with respect to the direction of the thickness of the TiN layer is within 10 to 50 nm, adhesion can be much improved to allow for easier epitaxial growth. Particularly, the average width of TiN crystals is preferably set to 10 to 30 nm.

When the average width of TiN crystals in a perpendicular direction with respect to the direction of the thickness of the TiN layer is 10 nm or more, grain boundaries in a unit area are not excessively increased and thus an area for epitaxial growth is ensured. When the average width of TiN crystals in a perpendicular direction with respect to the direction of the thickness of the TiN layer is 50 nm or less, the strength of the TiN grain is still maintained and thus the TiN layer is hard to destroy or render to fracture, even when a hard impact is applied.

(Producing Method)

An example of a method of producing cemented carbide included in a cutting tool according to the present invention will be described.

First, tungsten carbide (WC) powder is mixed with metal cobalt powder (Co) of 5.0 to 15.0 vol % and, as compound powder for forming the β-phase, titanium carbide powder of 0.8 to 4.5 vol %, and tantalum carbide of 0.5 to 7.0 vol %.

The powder mixed as described above is blended and pulverized into slurry, a binder is added to the slurry, and then, the slurry is dried using a spray drier or the like, so as to granulate the blended powder. Subsequently, press-molding is performed using the granulized powder to mold a cutting tool. Then, the molded powder compact is degreased in a sintering furnace, and then sintered at a temperature of 1420 to 1550 degrees in Celsius for 1 to 1.5 hours, thereby producing cemented carbide.

Subsequently, as a grinding process, the surface of the substrate made of the cemented carbide is ground with a brush using an abrasive grain having the size of about #400 to 1000. This allows the β-phase of solid solution of at least one type selected from a group consisting of carbide, nitride, and carbonitride containing W and a material selected from a group consisting of Ti, Ta, Nb, and Zr to be exposed. Also, this makes it possible to prepare the substrate in a state such that the TiN layer can epitaxially grow on the β-phase readily. Specifically, the rotation number, the pressure and the like of the brush in the grinding process are adequately adjusted so as to provide an interface between the substrate and the TiN layer having Rmax of 0.05 to 0.35 μm with respect to the reference length of 10 μm.

In addition, the grinding process using the brush is preferable in comparison with other methods such as sand blasting or etching, by which surface roughness is likely to increase, since the surface roughness can be adjusted to within the aforementioned range by the grinding process using the brush.

Subsequently, as a pre-process, a mixed gas containing $H_2$ of 50 to 75 vol % and $N_2$ of 25 to 50 vol % totalized to 100 vol % is introduced to a CVD furnace. The CVD furnace is controlled so that the value Vg/Vr (l/min) is in the range from 0.1 to 0.3 when the volume of the introduced gas at ordinary temperature and pressure is Vg (L/min), and the volume of the CVD furnace is Vr(L). Then the substrate is held in the CVD furnace. The object of this pre-process is reduction of oxidization of the surface of the substrate and generation of N dangling bonds on the surface of the substrate. This allows the TiN layer deposited on the surface of the substrate to have the crystal of the same orientation as that of the β-phase of the surface of the substrate. That is, it is possible to make the TiN layer to epitaxially grow with the β-phase on the surface of the substrate readily.

Preferably, the pre-process is performed in a time period of 10 to 60 minutes, with the pressure in the CVD furnace of 10 to 30 kPa, and a processing temperature of 850 to 950 degrees in Celsius. Within these ranges, the surface of the substrate will be in a condition that allows epitaxial growth to occur readily.

Then, as a forming process of the TiN layer, a mixed gas containing $TiCl_4$ of 0.3 to 1.2 vol %, $H_2$ of 35 to 65 vol %, and $N_2$ of 35 to 65 vol % totalized to 100 vol % is introduced to a CVD furnace. The CVD furnace is controlled so that the value Vg/Vr (l/min) is in the range from 0.7 to 1.1 under a constant pressure. Then, the TiN layer having an epitaxially grown part on the β-phase exposed at the surface of the substrate is deposited using a CVD method.

In this forming process of the TiN layer, the value of Vg(L/min) is large. That is, the amount of the introduced gas significantly increases in comparison with the pre-process. In this condition, the velocity of the gas flowing through the CVD furnace increases in a constant pressure atmosphere. This makes it possible to supply the energy required for epitaxial growth of the TiN layer deposited by the CVD method as kinetic energy.

Preferably, the pressure is set to 7 to 20 kPa, and the processing temperature is set to 860 to 1000 degrees in Celsius. These ranges readily allow the TiN layer to grow epitaxially on the surface of the substrate.

As described in the aforementioned producing method, it is possible for the TiN layer to grow epitaxially on the β-phase exposed at the surface of the substrate by performing a prescribed depositing process of the TiN layer after a prescribed grinding process and a prescribed pre-process. Also, it is possible to improve adhesion between the coating layer(s) including the TiN layer and the substrate.

When the surface of the substrate is roughened as conventionally performed, hardly any epitaxial growth occurs. However, when the surface of the substrate is ground, oxidization of the surface progresses, so that the TiN layer can be epitaxially grown on the β-phase at the surface of the substrate. Preferably, the grinding process according to the present invention provides a mirror finished surface or Rmax of 0.05 μm or less.

While cemented carbide, which is the material of the substrate, has a hexagonal crystal such as tungsten carbide, the TiN layer has a cubical crystal. Since they have different crystal structures, it has been very difficult to match the crystal orientation of the TiN layer deposited on the surface of the substrate with that of the β-phase, and it has been necessary to form mismatch dislocations or the like.

Further, in order to allow for epitaxial growth of the TiN layer deposited on the surface of the substrate with the β-phase of the substrate, it has been necessary to match the width of the crystal lattice of the substrate with that of the TiN layer. However, significant energy is required to match the widths of the crystal lattices and it has been difficult to apply sufficient energy in the forming process of the TiN layer when the TiN layer was deposited using a CVD method.

Thereupon, as a result of repeated experiments, the applicant succeeded in epitaxial growth of the TiN layer on the β-phase in the interface with the substrate, which has not been possible conventionally, by sequentially performing: (1) a grinding process for exposing the β-phase made of at least one type of solid solution selected from a group consisting of carbide, nitride, and carbonitride containing W and a material selected from a group consisting of Ti, Ta, Nb, and Zr at the surface of the substrate and smoothing the surface of the substrate; (2) a pre-process for oxidization reduction of the surface of the substrate and generation of N dangling bonds on the surface of the substrate; and (3) a forming process of the TiN layer by generating gas flow in the CVD furnace in a prescribed condition to supply energy required for the epitaxial growth of the TiN layer.

Hereinafter, examples of the present invention will be described with reference to tables.

EXAMPLE

Tungsten carbide (WC) powder having an average particle diameter of 1.4 μm, metal cobalt (Co) powder having an average particle diameter of 1.6 μm, titanium carbide (TiC) powder having an average particle diameter of 1.5 μm, TaC powder having an average particle diameter of 1.4 μm, and other compositions such as ZrC or NbC are added and mixed in the respective compositions shown in Table 1. The mixed powder is molded in the shape of a cutting tool (CNMG120408) using a press-molding. After a binder removal process, the molded cutting tool is sintered under the conditions shown in Table 1, thereby producing cemented carbide (sample Nos. A to D).

TABLE 1

| Sample | Composition (mass %) | | | | | | Sintering | |
| --- | --- | --- | --- | --- | --- | --- | --- | --- |
| | | | | | | | Maximum | Holding |
| No. | WC | Co | TiC | TaC | ZrC | NbC | Temperature (° C.) | Time (hr) |
| A | 90.6 | 8 | 0.2 | 1.2 | 0 | 0 | 1460 | 1 |
| B | 84.5 | 7.5 | 1.8 | 4.7 | 0.3 | 1.2 | 1440 | 1.2 |
| C | 90.8 | 8.2 | 0.2 | 0.3 | 0.1 | 0.4 | 1500 | 1 |
| D | 92 | 8 | 0 | 0 | 0 | 0 | 1450 | 1.4 |

The amount of β-phase crystals included in the cemented carbide was measured for sample Nos. A to D using X-ray fluorescence (XRF), and carbide conversion and volume conversion were calculated to obtain No. A sample of 1.4 vol %, No. B sample of 8 vol %, No. C sample of 1 vol %, and No. D sample of 0 vol %.

Samples No. 1 to 15 were prepared using the cemented carbide samples Nos. A to D as substrates, and the respective grinding processes were applied to the surfaces of samples as shown in Table 2. Here, the layer thicknesses in Table 2 were obtained by: taking scanning electron microscope (SEM) photos for 5 points in arbitrary cross-sections, each of which includes an interface between the substrate and the coating layer(s) or an interface between coating layers; measuring respective layer thicknesses for some points; and averaging the measured values.

TABLE 2

| Sample No | Substrate Base Material | Processing Abrasive Type | Processing Grain Size | Rmax μm | Pre-Process[Note 2] | Film Composition[Note 1] TiN[Note 3] | TiCN | HT-TiCN | TiCNO | Al2O3 | TiN | Epitaxial Relationship Exists or Not |
|---|---|---|---|---|---|---|---|---|---|---|---|---|
| 1 | A | Brush | 400 | 1.5 | Pre-Process 1 [15] | TiN1 (0.2) <20> | TiCN1 (2.1) | TiCN3 (0.3) | TiCNO1 (0.05) | α-Al2O3 (0.4) | TiN5 (0.5) | ○ |
| 2 | A | Brush | 400 | 1.6 | Pre-Process 2 [30] | TiN2 (0.3) <25> | TiCN1 (2.2) | TiCN3 (0.5) | TiCNO2 (0.1) | α-Al2O3 (0.5) | TiN6 (1.0→0.5) | ○ |
| 3 | B | Brush | 1000 | 0.1 | Pre-Process 1 [25] | TiN1 (0.4) <20> | TiCN2 (3.2) | TiCN3 (0.5) | TiCNO2 (0.1) | α-Al2O3 (0.7) | TiN5 (0.7) | ○ |
| 4 | B | Brush | 600 | 1.2 | Pre-Process 2 [15] | TiN1 (0.5) <25> | TiCN2 (1.7) | TiCN4 (0.2) | TiCNO1 (0.05) | α-Al2O3 (0.9) | TiN5 (0.7) | ○ |
| 5 | C | Brush | 600 | 1.4 | Pre-Process 2 [10] | TiN2 (0.2) <50> | TiCN1 (3.4) | TiCN4 (0.2) | TiCNO2 (0.1) | α-Al2O3 (0.4) | TiN5 (0.4) | ○ |
| 6 | C | Brush | 1000 | 0.1 | Pre-Process 1 [45] | TiN2 (0.3) <40> | TiCN2 (2.6) | TiCN3 (0.5) | TiCNO1 (0.05) | α-Al2O3 (0.8) | TiN5 (0.8) | ○ |
| 7 | A | Brush | 400 | 2.0 | Pre-Process 2 [35] | TiN1 (0.2) <10> | TiCN1 (2.4) | TiCN4 (0.5) | TiCNO2 (0.1) | α-Al2O3 (0.9) | TiN6 (0.5) | ○ |
| 8 | B | Brush | 400 | 1.5 | Pre-Process 1 [15] | TiN2 (0.4) <35> | TiCN2 (3.8) | TiCN4 (0.5) | TiCNO2 (0.1) | α-Al2O3 (0.5) | TiN5 (0.56) | ○ |
| 9 | C | Brush | 600 | 1.3 | Pre-Process 1 [20] | TiN1 (0.7) <25> | TiCN1 (3.8) | TiCN3 (0.5) | TiCNO1 (0.05) | α-Al2O3 (0.5) | TiN5 (0.3) | ○ |
| 10 | A | Brush | 1000 | 1.0 | Pre-Process 2 [45] | TiN2 (0.9) <30> | TiCN2 (2.2) | TiCN4 (0.5) | TiCNO2 (0.1) | α-Al2O3 (0.2) | TiN6 (0.7) | ○ |
| 11 | A | Brush | 400 | 1.5 | — | TiN1 (0.3) <20> | TiCN2 (2.5) | TiCN4 (0.5) | TiCNO2 (0.1) | α-Al2O3 (0.3) | TiN6 (0.8) | x |
| 12 | B | Brush | 1000 | 0.9 | Pre-Process 2 [20] | TiN4 (0.4) <60> | TiCN1 (2.8) | TiCN3 (0.5) | TiCNO1 (0.05) | α-Al2O3 (0.4) | TiN5 (0.2) | x |
| 13 | C | Brush | 600 | 1.4 | Pre-Process 1 [60] | TiN1 (0.6) <25> | TiCN1 (3.5) | TiCN3 (0.5) | TiCNO2 (0.1) | α-Al2O3 (0.5) | TiN5 (0.4) | x |
| 14 | D | Blast | 400 | 3.0 | Pre-Process 1 [25] | TiN1 (0.1) <15> | TiCN2 (3.3) | TiCN4 (0.5) | — | κ-Al2O3 (0.3) | TiN5 (0.5) | x |
| 15 | A | Brush | 600 | 1.3 | Pre-Process 3 [15] | TiN3 (0.6) <70> | TiCN2 (2.8) | TiCN3 (0.5) | TiCNO2 (0.1) | α-Al2O3 (0.3) | TiN6 (0.7) | x |
| 16 | D | Brush | 1000 | 1.0 | Pre-Process 1 [20] | TiN1 (0.4) <20> | TiCN1 (3.4) | TiCN4 (0.5) | TiCNO1 (0.05) | α-Al2O3 (0.3) | TiN5 (0.7) | x |

[Note 1] [ ] means a processing time in minute.
[Note 2] ( ) means a layer thickness in μm.
[Note 3] < > means a particle diameter in nm.

The pre-process was performed under the conditions shown in Tables 2 and 3. Then, a forming process of layers shown in Table 2 was performed using the CVD method under the conditions of Table 3 to produce the cutting tools of No. 1 to 15 samples.

Whether or not the TiN layer includes the crystals, which have the same orientation as the β-phase, right above the β-phase on the surface of the substrate, i.e., whether or not epitaxial growth is achieved, was examined by using selected-area electron diffraction. In addition, the inventors

TABLE 3

| Coating | Gas Mixture Composition (vol %) | Vg/Vr[Note 4] | Film depositing Temperature (°C.) | Pressure (kPa) |
|---|---|---|---|---|
| Pre-process 1 | $N_2$: 33, $H_2$: For Remaining | 0.19 | 860 | 12 |
| Pre-process 2 | $N_2$: 29, $H_2$: For Remaining | 0.12 | 900 | 20 |
| Pre-process 3 | $N_2$: 0, $H_2$: For Remaining | 0.26 | 880 | 15 |
| TiN1 | $TiCl_4$: 1.0, $N_2$: 50, $H_2$: For Remaining | 0.83 | 900 | 10 |
| TiN2 | $TiCl_4$: 0.8, $N_2$: 40, $H_2$: For Remaining | 0.9 | 880 | 16 |
| TiN3 | $TiCl_4$: 1.0, $N_2$: 50, $H_2$: For Remaining | 0.56 | 880 | 18 |
| TiN4 | $TiCl_4$: 4.0, $N_2$: 35, $H_2$: For Remaining | 0.45 | 800 | 12 |
| TiCN1 | $TiCl_4$: 2.0, $N_2$: 23, $CH_3CN$: 0.6, $H_2$: For Remaining | — | 865 | 9 |
| TiCN2 | $TiCl_4$: 2.5, $N_2$: 30, $CH_3CN$: 0.9, $H_2$: For Remaining | — | 840 | 9 |
| TiCN3 | $TiCl_4$: 3.0, $N_2$: 20, $CH_4$: 6.0, $H_2$: For Remaining | — | 1010 | 15 |
| TiCN4 | $TiCl_4$: 1.7, $N_2$: 35, $CH_4$: 6.0, $H_2$: For Remaining | — | 1010 | 30 |
| TiCNO1 | $TiCl_4$: 1.6, $CH_4$: 3.3, $N_2$: 16.5, $CO_2$: 4.0, $H_2$: For Remaining | — | 1010 | 7.0 |
| TiCNO2 | $TiCl_4$: 2.0, $CH_4$: 4.0, $N_2$: 20, $CO_2$: 2.5, $H_2$: For Remaining | — | 1010 | 7.0 |
| $Al_2O_3$1 | $AlCl_3$: 1.6, $CO_2$: 3.8, $H_2S$: 0.03, $H_2$: For Remaining | — | 1010 | 9 |
| TiN5 | $TiCl_4$: 2.0, $N_2$: 30, $H_2$: For Remaining | — | 1010 | 50 |
| TiN6 | $TiCl_4$: 2.0, $N_2$: 40, $H_2$: For Remaining | — | 1010 | 20 |

[Note 4] Vg/Vr is obtained by dividing a supply flow rate Vg(L/min) by an effective volume Vr(L) inside the furnace.

observed cross-sections of an interface between each base material and the TiN layer by using high resolution transmission electron microscope analysis (HR-TEM) to determine that the TiN layer has the same orientation as the β-phase if TiN has an area having lattice fringes apparently continuous from the β-phase of the base material in a multiple wave interference image. By contrast, the inventors determined that the TiN layer on the β-phase does not have the same orientation as β-phase if lattice fringes in TiN are not continuous from the β-phase of the base material and the orientations of respective crystals are mismatched. FIG. 1 is a schematic diagram illustrating a cross-section for examining epitaxial growth in an interface between the substrate and the coating layer(s).

As can be seen from the result shown in Table 2, regarding No. 1 to 10 samples obtained by using a producing method according to the present invention, an area having lattice fringes apparently continuous from the β-phase of the base material could be found in the TiN layer, i.e., a portion having the same orientation with that of the β-phase was found right above the β-phase. By contrast, regarding No. 11 to 15 samples, the lattice fringes or the TiN layer were discontinuous from the β-phase right above the β-phase and thus a portion having the same orientation with that of the β-phase could not be found right above the β-phase.

A cutting test was performed under the conditions described below using No. 1 to 15 samples. Wear resistance (flank wear, boundary wear), defect resistance, and cutting edge states were measured for each sample. The results are shown in Table 4.
(Cutting Condition)
(1) Wear Resistance Test
Work Material: SUS304 Cylindrical Material
Tool Shape: CNMG120408
Cutting Speed: 200 m/min
Cutting feed rate: 0.2 mm/rev
Cutting Depth: 1.5 mm
Cutting Time: 20 min
Cutting Condition Wet Type Cutting
(2) Fracture Resistance Test
Work Material: SUS304 Cylindrical Material (grooved)
Tool Shape: CNMG120408
Cutting Speed: 170 m/min
Cutting feed rate: 0.3 mm/rev
Cutting Depth: 1.5 mm
Cutting Condition Wet Type cutting

TABLE 4

| Sample No. | Wear Test: Wear Amount (mm) | | Fracture Resistance Number of Impacts at which Fracture Form | Cutting Edge State |
|---|---|---|---|---|
| | Flank Wear | Boundary Wear | | |
| 1 | 0.14 | 0.24 | 1600 | No Damage |
| 2 | 0.16 | 0.25 | 1400 | No Damage |
| 3 | 0.15 | 0.24 | 1500 | No Damage |
| 4 | 0.15 | 0.26 | 1450 | No Damage |
| 5 | 0.16 | 0.25 | 1550 | No Damage |
| 6 | 0.17 | 0.27 | 1400 | No Damage |
| 7 | 0.17 | 0.26 | 1450 | No Damage |
| 8 | 0.15 | 0.25 | 1500 | No Damage |
| 9 | 0.16 | 0.24 | 1550 | No Damage |
| 10 | 0.15 | 0.25 | 1450 | No Damage |
| 11 | 0.22 | 0.34 | 900 | Layer peeling |
| 12 | 0.23 | 0.33 | 850 | Chipping, Layer peeling |
| 13 | 0.22 | 0.38 | 800 | Chipping, Layer peeling |
| 14 | 0.24 | 0.40 | 850 | Layer peeling |
| 15 | 0.26 | 0.39 | 700 | Chipping |
| 16 | 0.25 | 0.37 | 800 | Chipping, Layer peeling |

Wear Condition: SUS304, 200 m/min f = 0.2 d = 1.5 wet
Cutting Interrupted Condition: SUS304 (grooved) 170 m/min f = 0.3 d = 1.5 mm wet As can be seen from Table 4, satisfactory results could be obtained for every one of the flank face wear test, the periphery wear test, the defect resistance test, and the cutting edge test with No. 1 to 10 samples having the TiN layer including crystals, which have the same orientation with the β-phase, on the β-phase at the surface of the substrate in comparison to the results obtained with No. 11 to 15 samples, in which an epitaxial growth portion was not found.

From the result, it can be considered that since the TiN layer includes crystals, which have the same orientation with the β-phase, on the β-phase, adhesion between the substrate and the coating layer(s) is improved in the portion and thus any fracture that could have been generated during cutting was prevented. Also it can be considered that pressure in a part where the pressure is usually concentrated could be suppressed, and thus durability of the cutting tool could be improved.

Now, a cutting method using the cutting tool according to the present invention will be described with reference to the accompanying drawings.

FIGS. 2 to 4 are schematic diagrams illustrating a cutting method according to the present invention. First, as shown in FIG. 2, a cutting tool 15 and a work 20 to be cut are prepared. While the work 20 is rotated, the cutting tool 15 approaches the work 20. Alternatively, the work 20 may approach the cutting tool 15 to bring the tool 15 and the work 20 closer to each other.

Subsequently, as shown in FIG. 3, the work is cut by allowing the cutting tool 15 to make contact with the work material 20. Then, as shown in FIG. 4, the cutting tool 15 is separated from the work 20. When cutting is to be performed continuously, the cutting tool 15 can repeatedly make contact with different spots on the work 20 while the work is continuously rotated.

While external diameter machining, particularly, alongside machining, has been described as an example, the present invention may be applied to any other cutting, such as inner diameter machining.

Figure 1:
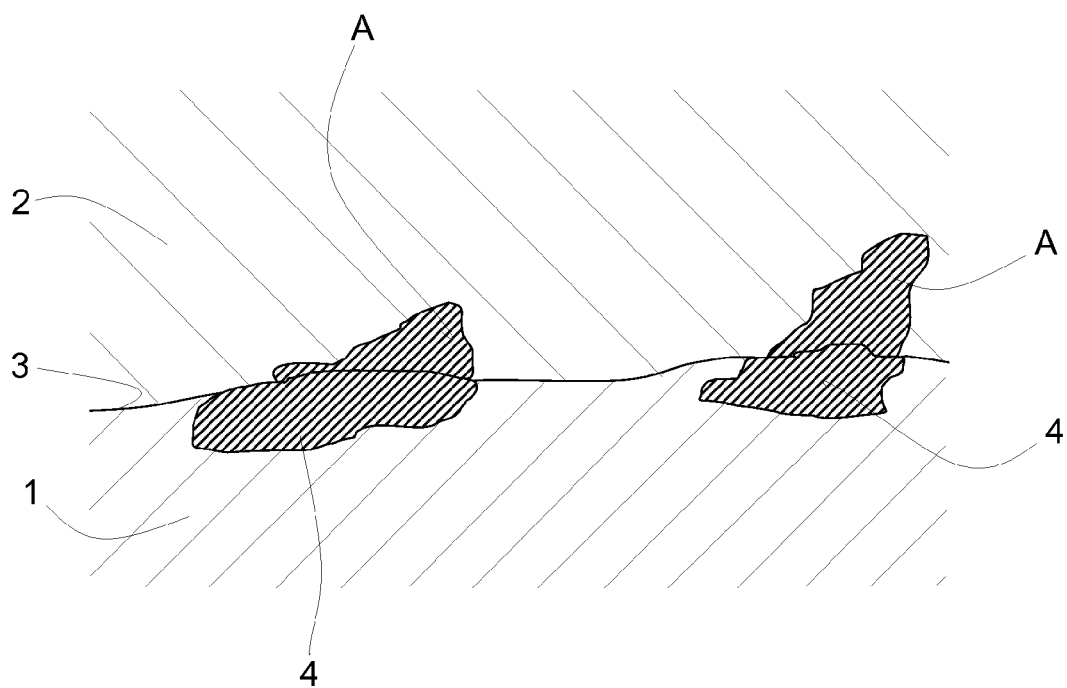
FIG. 1 is a schematic diagram illustrating a cross-section including an interface between a base material and a coating layer(s).
Figure 2:
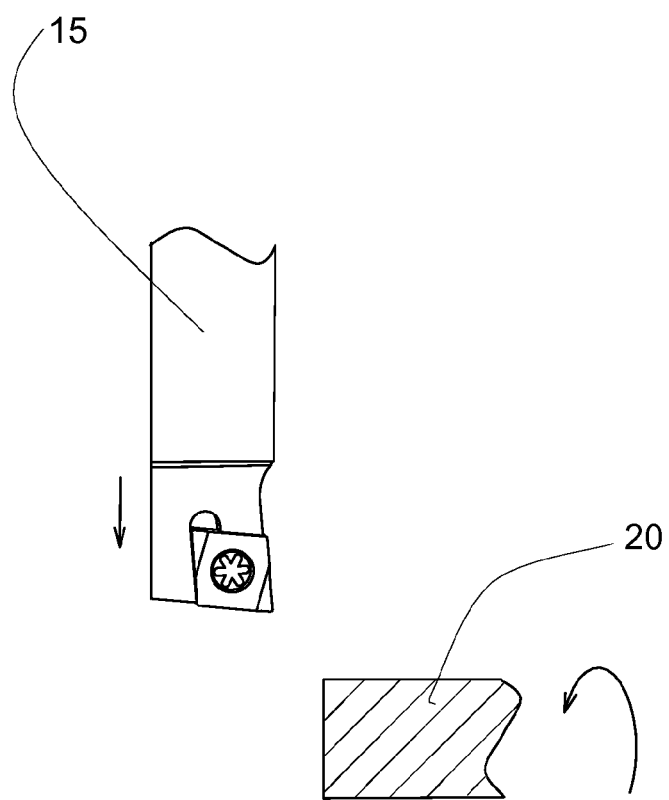
FIG. 2 is a schematic diagram illustrating a process of a cutting method according to the present invention.
Figure 3:
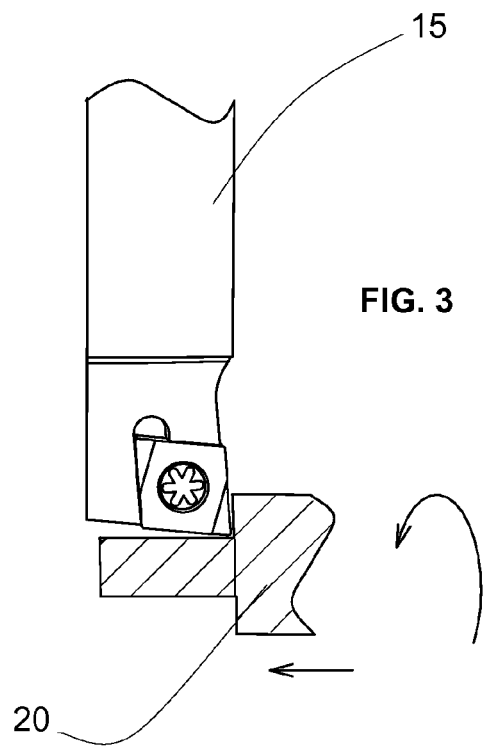
FIG. 3 is a schematic diagram illustrating a process of a cutting method according to the present invention.
Figure 4:
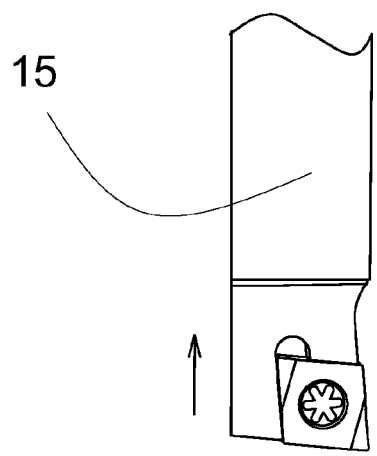
FIG. 4 is a schematic diagram illustrating a process of a cutting method according to the present invention.
Figure 4:
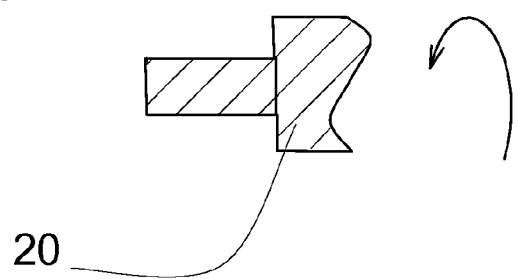

| Description of the Reference Numerals | |
|---|---|
| 1: | BASE MATERIAL |
| 2: | TiN LAYER |
| 3: | INTERFACE |
| 4: | β-phase |
| A: | EPITAXIAL GROWTH PORTION IN TiN LAYER (portion including crystals having the same orientation as that of the β-phase) |

The invention claimed is:

1. A cutting tool made of a hard material, comprising:
a substrate including a hard phase and a binding metal; and
a TiN layer on the surface of the substrate,
wherein the substrate contains a β-phase of solid solution of at least one type selected from a group consisting of carbide, nitride, and carbonitride containing W and a material selected from a group consisting of Ti, Ta, Nb, and Zr;
at least part of the β-phase is at the surface of the substrate; and
the TiN layer comprises crystals, which have the same orientation as the β-phase crystals, on the β-phase.

2. The cutting tool according to claim 1, wherein the substrate contains the β-phase of 1 to 8 wt %.

3. The cutting tool according to claim 1, wherein a Rmax with respect to a reference length of 10 μm in an interface between the substrate and the TiN layer is 0.05 to 2.0 μm.

4. The cutting tool according to claim 1, wherein an average crystal width in a direction perpendicular to a thickness direction of the TiN layer is 10 to 50 nm.

5. A cutting method for cutting a work using the cutting tool of claim 1, the cutting method comprising:
relatively approaching the cutting tool to the work material;
cutting the work by allowing the cutting tool to contact with the work while either of the work or the cutting tool is rotated; and
relatively separating the work from the cutting tool.

6. A cutting tool made of a hard material, comprising:
a substrate including a hard phase and a binding metal and a TiN layer on the surface of the substrate,
wherein the substrate contains a β-phase of solid solution of at least one type selected from a group consisting of carbide, nitride, and carbonitride containing W and a material selected from a group consisting of Ti, Ta, Nb, and Zr,
at least part of the β-phase is at the surface of the substrate; and
the TiN layer comprises an epitaxially grown portion on the β-phase at the surface of the substrate in an interface with the substrate.

7. A method of producing a cutting tool made of a hard material, the method comprising:
grinding a substrate including a β-phase of solid solution of at least one type selected from a group consisting of carbide, nitride, and carbonitride containing W and a material selected from a group consisting of Ti, Ta, Nb, and Zr to expose the β-phase on a surface of the substrate;
performing a pre-process of oxidization reduction of the surface of the substrate in hydrogen and nitrogen containing gas and generation of N dangling bonds on the surface of the substrate in time period of 10 to 45 minutes; and
forming a TiN layer including an epitaxial growth portion right above the β-phase exposed on the surface of the substrate using a chemical vapor deposition.

8. The method according to claim 7, wherein the pre-process is performed by introducing a mixed gas containing $H_2$ of 50 to 75 vol % and $N_2$ of 25 to 50 vol % totalized to 100 vol % into a CVD furnace, controlling the CVD furnace so that the value Vg/Vr(1/min) is in the range from 0.1 to 0.3, where the volume of the introduced gas at ordinary temperature and pressure is Vg(L/min), and the volume of the CVD furnace is Vr(L), and holding the substrate in the CVD furnace.

9. The method according to claim 7, wherein the forming the TiN layer is performed by introducing a mixed gas containing $TiCl_4$ of 0.3 to 1.2 vol %, $H_2$ of 35 to 65 vol %, $N_2$ of 35 to 65 vol % totalized to e 100 vol % into the CVD furnace, controlling the CVD furnace so that the value Vg/Vr is in the range from 0.7 to 1.1(1/min), and forming a TiN layer having an epitaxially grown portion on the β-phase exposed on the surface of the substrate using a CVD method.

10. The method of claim 7, wherein said performing step comprises performing a pre-process of oxidization reduction of the ground surface of the substrate and generation of N dangling bonds on the ground surface of the substrate.

11. A cutting tool made of a hard material, comprising:
a substrate including a hard phase and a binding metal and wherein the substrate contains a β-phase of solid solution of at least one type selected from a group consisting of carbide, nitride, and carbonitride containing W and a material selected from a group consisting of Ti, Ta, Nb, and Zr and wherein at least part of the β-phase is at the surface of the substrate; and
a TiN layer on the surface of the substrate, wherein the TiN layer comprises crystals on the β-phase that have the same orientation as the β-phase crystals, the TiN layer further comprising crystal lattices having continuous lattice fringes which have the same orientation as the β-phase crystals and extend from the β-phase of the substrate to the grains of the TiN layer.

* * * * *